(12) United States Patent
Fang

(10) Patent No.: US 12,205,995 B2
(45) Date of Patent: Jan. 21, 2025

(54) HIGH-VOLTAGE TRANSISTOR AND METHOD FOR FABRICATING THE SAME

(71) Applicant: United Microelectronics Corp., Hsinchu (TW)

(72) Inventor: Ling-Gang Fang, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/103,620

(22) Filed: Nov. 24, 2020

(65) Prior Publication Data
US 2022/0130964 A1  Apr. 28, 2022

(30) Foreign Application Priority Data

Oct. 28, 2020  (CN) .......................... 202011174734.3

(51) Int. Cl.
*H01L 29/40*  (2006.01)
*H01L 29/423*  (2006.01)
*H01L 29/66*  (2006.01)
*H01L 29/78*  (2006.01)

(52) U.S. Cl.
CPC .......... *H01L 29/402* (2013.01); *H01L 29/401* (2013.01); *H01L 29/42364* (2013.01); *H01L 29/66681* (2013.01); *H01L 29/7816* (2013.01); *H01L 29/7835* (2013.01)

(58) Field of Classification Search
CPC ............. H01L 29/402; H01L 29/42368; H01L 29/7835; H01L 29/407; H01L 29/404; H01L 29/405; H01L 29/7816; H01L 29/66681; H01L 29/42376; H01L 29/42364; H01L 29/401

USPC ................. 257/316, 339, E29.133, E29.255, 257/E29.256; 438/275, 585, 591
See application file for complete search history.

(56) References Cited

U.S. PATENT DOCUMENTS

| | | | | |
|---|---|---|---|---|
| 5,029,130 | A | * 7/1991 | Yeh | H01L 29/40114 365/186 |
| 5,304,836 | A | * 4/1994 | Lao | H01L 29/7813 257/400 |
| 6,232,185 | B1 | * 5/2001 | Wang | H01L 29/40114 438/257 |
| 6,649,475 | B1 | * 11/2003 | Wen | H01L 29/7885 257/E21.422 |
| 7,662,684 | B2 | 2/2010 | Lee et al. | |
| 9,871,132 | B1 | * 1/2018 | Liu | H01L 29/7835 |

(Continued)

OTHER PUBLICATIONS

Libre Texts, 10.6: Semiconductor p-n Junctions.*

*Primary Examiner* — David Chen
(74) *Attorney, Agent, or Firm* — J.C. PATENTS

(57) ABSTRACT

A structure of a semiconductor device, including a substrate, is provided. A first gate insulating layer is disposed on the substrate. A second gate insulating layer is disposed on the substrate. The second gate insulating layer is thicker than the first gate insulating layer and abuts the first gate insulating layer. A gate layer has a first part gate on the first gate insulating layer and a second part gate on the second gate insulating layer. A dielectric layer has a top dielectric layer and a bottom dielectric layer. The top dielectric layer is in contact with the gate layer, and the bottom dielectric layer is in contact with the substrate. A field plate layer is disposed on the dielectric layer and includes a depleted region, and is at least disposed on the bottom dielectric layer. A method for fabricating the semiconductor device is provided too.

10 Claims, 2 Drawing Sheets

(56) References Cited

U.S. PATENT DOCUMENTS

| | | |
|---|---|---|
| 9,871,134 B2 | 1/2018 | Yadav et al. |
| 9,905,428 B2 | 2/2018 | Strachan et al. |
| 2001/0015461 A1* | 8/2001 | Ebina ................ H01L 29/78609 257/347 |
| 2003/0141559 A1* | 7/2003 | Moscatelli ........ H01L 21/28167 257/E21.639 |
| 2004/0038435 A1* | 2/2004 | Wieczorek ............ H01L 29/513 438/13 |
| 2005/0136676 A1* | 6/2005 | Liu .................... H01L 29/6656 438/703 |
| 2005/0247984 A1* | 11/2005 | Jung .................. H01L 29/6656 257/E29.054 |
| 2006/0022281 A1* | 2/2006 | Yamazaki ....... H01L 21/823418 257/E21.639 |
| 2007/0063271 A1* | 3/2007 | Takimoto .......... H01L 29/66681 257/330 |
| 2008/0164537 A1* | 7/2008 | Cai .................. H01L 29/66659 438/303 |
| 2009/0003065 A1* | 1/2009 | Mihnea ............. H01L 27/11521 438/257 |
| 2010/0090278 A1* | 4/2010 | Rohrer .............. H01L 29/66659 257/E29.256 |
| 2010/0148258 A1* | 6/2010 | Cho .................. H01L 29/42368 257/E29.256 |
| 2013/0134512 A1* | 5/2013 | Cheng ................... H01L 29/402 257/E29.256 |
| 2013/0161767 A1* | 6/2013 | Rouh .................. H01L 29/4941 438/514 |
| 2014/0191317 A1* | 7/2014 | Qian ................... H01L 29/1083 438/289 |
| 2014/0197489 A1* | 7/2014 | Chu .................. H01L 29/66659 438/286 |
| 2014/0252499 A1* | 9/2014 | Lin .................... H01L 29/7833 257/408 |
| 2014/0264360 A1* | 9/2014 | Huang ................ H01L 29/2003 257/268 |
| 2015/0001619 A1* | 1/2015 | Yoo .................... H01L 29/7823 438/286 |
| 2017/0263764 A1* | 9/2017 | Lin .................... H01L 29/1095 |
| 2018/0261676 A1* | 9/2018 | Sonsky ............. H01L 29/42368 |
| 2019/0221666 A1* | 7/2019 | Bang .................. H01L 29/7835 |
| 2019/0288112 A1* | 9/2019 | Wang .................... H01L 29/517 |

* cited by examiner

HIGH-VOLTAGE TRANSISTOR AND METHOD FOR FABRICATING THE SAME

CROSS-REFERENCE TO RELATED APPLICATION

This application claims the priority benefit of China application serial no. 202011174734.3, filed on Oct. 28, 2020. The entirety of the above-mentioned patent application is hereby incorporated by reference herein and made a part of this specification.

BACKGROUND

Technical Field

This disclosure relates to a semiconductor fabrication technology, and in particular to a structure of a semiconductor device and a method for fabricating the same.

Description of Related Art

With diversification of the functions of electronic products, their control circuits also need to be able to simultaneously drive high-voltage devices operating at a high-voltage and low-voltage devices operating at a low voltage. A high-voltage transistor needs to withstand a very high operating voltage in response to the operation of the high-voltage devices. Therefore, the structure of the transistor needs to be able to withstand the high voltage, that is, it needs to increase its collapse voltage.

A structure of the transistor such as a laterally diffused metal oxide semiconductor (LDMOS) has also been proposed in response to the need for high-voltage transistors. Other proposals further include disposing a field plate to assist a gate structure in controlling a channel layer on a substrate.

Based on the high-voltage operation mechanism, a drain region abuts the gate structure, and a boundary region of the drain region is generally prone to generate a high electric field, which causes the transistor to collapse. It is generally known that generation of the high electric field may be slowed down by increasing insulation between the field plate and the substrate to prevent the transistor from collapsing. However, it is not easy to increase a thickness of an insulating layer between the field plate and the substrate under a fabrication process that is compatible with the general fabrication process so as to increase the collapse voltage.

The development of the structural design of the high-voltage transistors still needs to be continued.

SUMMARY

This disclosure provides a structure of a semiconductor device and a method for fabricating the same. For a transistor structure including a field plate, a generally compatible fabrication process may be used to improve an insulation capability between the field plate and a substrate in a drain region.

In an embodiment, the disclosure provides a structure of a semiconductor device. The structure of the semiconductor device includes a substrate. A first gate insulating layer is disposed on the substrate. A second gate insulating layer is disposed on the substrate. The second gate insulating layer is thicker than the first gate insulating layer, and abuts the first gate insulating layer. A gate layer has a first part gate on the first gate insulating layer and a second part gate on the second gate insulating layer. A dielectric layer has a top dielectric layer and a bottom dielectric layer. The top dielectric layer is in contact with the gate layer, and the bottom dielectric layer is in contact with the substrate. A field plate layer is disposed on the dielectric layer and includes a depleted region, and is at least disposed on the bottom dielectric layer.

In an embodiment, in the structure of the semiconductor device, the field plate layer further includes a doped polysilicon layer or a doped silicon layer on the depleted region.

In an embodiment, in the structure of the semiconductor device, the dielectric layer includes an oxide, a nitride, or an oxide and a nitride.

In an embodiment, in the structure of the semiconductor device, the dielectric layer is a single layer.

In an embodiment, in the structure of the semiconductor device, the dielectric layer includes the top dielectric layer, a vertical layer at a side wall of the gate layer; and the bottom dielectric layer on the substrate. The top dielectric layer, the vertical layer, and the bottom dielectric layer are connected together.

In an embodiment, in the structure of the semiconductor device, the top dielectric layer and the vertical layer are nitrides, and the bottom dielectric layer includes a nitride layer and an oxide layer.

In an embodiment, in the structure of the semiconductor device, the depleted region of the field plate layer provides an insulation capability to the dielectric layer.

In an embodiment, in the structure of the semiconductor device, the depleted region of the field plate layer is only on the bottom dielectric layer.

In an embodiment, in the structure of the semiconductor device, the depleted region of the field plate layer covers the top dielectric layer and the bottom dielectric layer.

In an embodiment, in the structure of the semiconductor device, the field plate layer and the gate layer are to be electrically connected to the same voltage source.

In an embodiment, the disclosure further provides a method for fabricating a semiconductor device, including providing a substrate. Thereafter, a first gate insulating layer and a second gate insulating layer abutting the first gate insulating layer are formed on the substrate. The second gate insulating layer is thicker than the first gate insulating layer. A gate layer, having a first part gate on the first gate insulating layer and a second part gate on the second gate insulating layer, is formed. A dielectric layer, having a top dielectric layer and a bottom dielectric layer, is formed. The top dielectric layer is in contact with the gate layer, and the bottom dielectric layer is in contact with the substrate. A field plate layer is formed on the dielectric layer. The field plate layer includes a depleted region, and is at least disposed on the bottom dielectric layer.

In an embodiment, in the method for fabricating the semiconductor device, the field plate layer further includes a doped polysilicon layer or a doped silicon layer on the depleted region.

In an embodiment, in the method for fabricating the semiconductor device, the dielectric layer includes an oxide, a nitride, or an oxide and a nitride.

In an embodiment, in the method for fabricating the semiconductor device, the dielectric layer is a single layer.

In an embodiment, in the method for fabricating the semiconductor device, the formed dielectric layer includes the top dielectric layer, a vertical layer at a side wall of the gate layer, and the bottom dielectric layer on the substrate.

The top dielectric layer, the vertical layer, and the bottom dielectric layer are connected together.

In an embodiment, in the method for fabricating the semiconductor device, an oxide layer is formed on the substrate, and a nitride layer is formed on the oxide layer so as to form the top dielectric layer, the vertical layer, and the bottom dielectric layer.

In an embodiment, in the method for fabricating the semiconductor device, the depleted region of the formed field plate layer provides an insulation capability to the dielectric layer.

In an embodiment, in the method for fabricating the semiconductor device, the depleted region of the formed field plate layer is only on the bottom dielectric layer.

In an embodiment, in the method for fabricating the semiconductor device, the depleted region of the formed field plate layer covers the top dielectric layer and the bottom dielectric layer.

In an embodiment, in the method for fabricating the semiconductor device, the formed field plate layer and the gate layer are to be electrically connected to the same voltage source.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

This disclosure relates to a semiconductor device and a method for fabricating the same. The semiconductor device is, for example, a structure of a high-voltage transistor. In an embodiment, the high-voltage transistor includes a field plate to assist in operating a gate structure to control a channel region in a substrate.

In an embodiment, a structure of a transistor may be achieved by using a fabrication process that is compatible with a fabrication process of a general device in other regions, which can improve an insulation capability between the field plate and the substrate in a drain region.

Some exemplary embodiments are listed below to illustrate the disclosure, but the disclosure is not limited thereto. Appropriate combinations between the multiple embodiments are also allowed.

Figure 1:
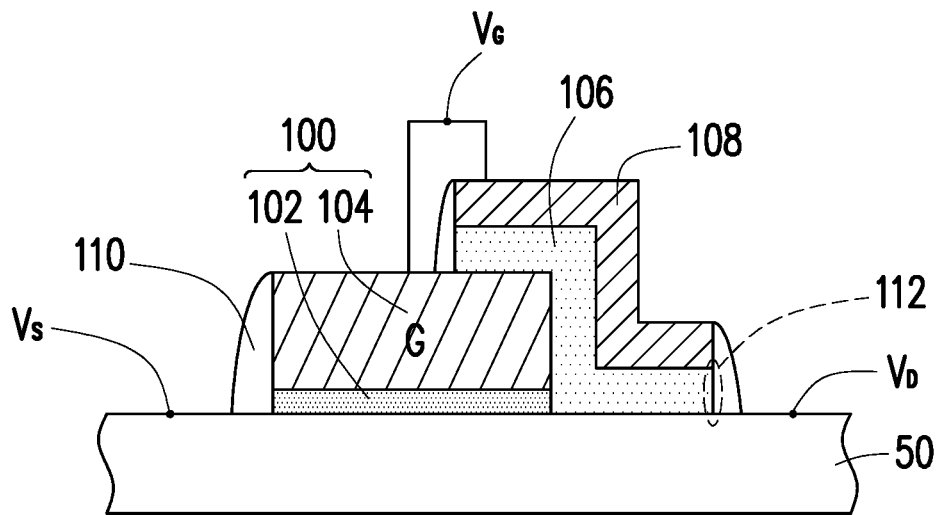
FIG. 1 is a schematic diagram of a cross-sectional structure of a semiconductor device that is being looked into according to an embodiment of the disclosure.

FIG. 1 is a schematic diagram of a cross-sectional structure of a semiconductor device that is being looked into according to an embodiment of the disclosure. With reference to FIG. 1, the disclosure looks into the performance of, for example, a LDMOS transistor. A gate structure 100 of the transistor is disposed on a substrate 50. The gate structure 100 includes a gate insulating layer 102 and a gate layer (G) 104. As usual, there will be some doped regions corresponding to the conductivity type in the substrate 50, which would not be described here. The doped region of the disclosure is not limited to a specific structure. With regards to the control of the gate, a field plate layer 108 is formed on the gate structure 100 at a drain end based on the need for a high-voltage operation. The field plate 108 is above the gate structure 100 and the substrate 50, and insulation is provided by a dielectric layer 106. In addition, a gap wall 110, for example, may also be formed on a side wall of the structure.

The field plate layer 108 and the gate layer 104 are connected to a same gate voltage $V_G$. A part of the field plate layer 108 is shown on the substrate 50 to provide assistance to a control function of a channel. The drain region of the gate structure 100 abuts the field plate layer 108 and receives a drain voltage $V_D$. A source region of the gate structure 100 receives a source voltage $V_S$.

A dielectric layer 106 provides an insulation capability between the field plate layer 108 and the substrate 50. As per the looking into by the disclosure, if a thickness of the dielectric layer 106 is insufficient, for example, as illustrated by a marked area 112, it may generate an excessively high electric field and prone to causing a collapse. In the disclosure, the insulation capability between the field plate layer 108 and the substrate 50 is being improved under a condition that is compatible with the fabrication process of the devices in the other regions, after looking into the structure of the transistor as shown in FIG. 1.

Figure 2:
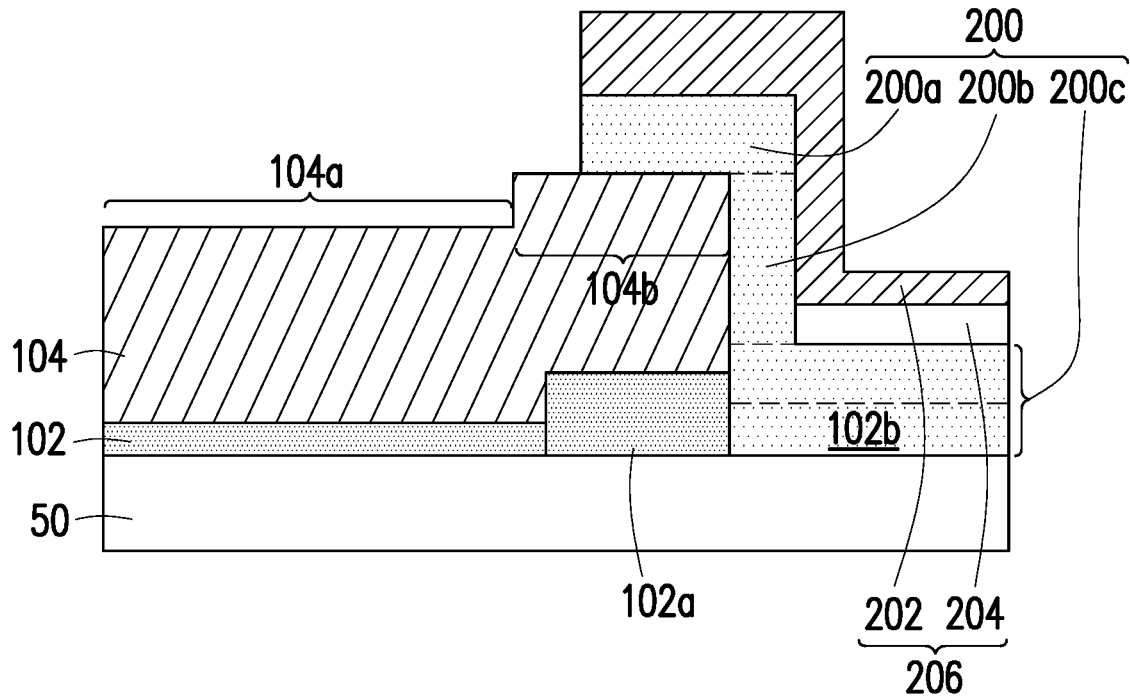
FIG. 2 is a schematic diagram of a cross-sectional structure of a semiconductor device according to another embodiment of the disclosure.

FIG. 2 is a schematic diagram of a cross-sectional structure of a semiconductor device according to another embodiment. With reference to FIG. 2, in an embodiment, an overall gate insulating layer may include a first gate insulating layer 102 and a second gate insulating layer 102a. The first gate insulating layer 102 abuts the second gate insulating layer 102a, and both layers are disposed on the substrate 50. A thickness of the second gate insulating layer 102a is, for example, greater than a thickness of the first gate insulating layer 102.

The gate layer 104 is formed on the first gate insulating layer 102 and the second gate insulating layer 102a. The gate layer 104 has a first part gate 104a on the first gate insulating layer 102. The gate layer 104 also has a second part gate 104b on the second gate insulating layer 102a. In this way, the gate layer 104 and the substrate 50 will achieve a greater insulation capability near the drain end. The second gate insulating layer 102a is, for example, a structure of a field oxide layer, so as to obtain a greater thickness, but is not limited thereto.

In an embodiment, for example, both the first gate insulating layer 102 and the second gate insulating layer 102a are oxides. In an embodiment, a dielectric layer 102b that is an oxide may also be formed on the substrate 50 first according to a change in the fabrication process. The dielectric layer 102b is configured to provide insulation between the substrate 50 and a subsequently formed field plate layer 206.

In an embodiment, the dielectric layer 102b may be a part of an overall dielectric layer 200. In an embodiment, the dielectric layer 200 includes a top dielectric layer 200a covering the gate layer 104, such as covering the second part gate 104b. The dielectric layer 200 also includes a bottom dielectric layer 200c covering the substrate 50. The dielectric layer 200 also includes a vertical layer 200b at a side wall of the gate layer 104, which connects the bottom dielectric layer 200c and the top dielectric layer 200a. As mentioned previously, the bottom dielectric layer 200c includes the bottom dielectric layer 102b.

In an embodiment, the dielectric layer 200 is, for example, a nitride or an oxide, and the top dielectric layer 200a, the vertical layer 200b, and the bottom dielectric layer 200c may be formed together. The dielectric layer 102b may be formed first during the process of forming other devices, but is not limited thereto.

In an embodiment, both the top dielectric layer 200a and the vertical layer 200b are nitride layers, and the bottom dielectric layer 200c is a stacked layer of an oxide and a nitride.

In an embodiment, the field plate layer 206 is formed on the dielectric layer 200. It should be noted here that a material of the field plate layer 206, in an embodiment, forms a doped layer 202 such as a doped silicon layer or a doped polysilicon layer according to, for example, a deposition manner or an epitaxial growth manner. In addition, the depleted region 204 may be formed in the field plate layer 206 according to the technology of the doping process. The depleted region 204 may, for example, also be an undoped region or at a level close to being undoped. A function of the depleted region 204 may be to provide the insulation capability. Therefore, in actual effect, the depleted region 204 is formed through the control of the doping technology during the process of forming the field plate layer 206, so as to substantially provide the function of an insulating layer. In such an embodiment, the bottom dielectric layer 200c of the dielectric layer 200 may not need to form an insulating layer to increase thickness, so as to achieve the insulation capability. The insulation capability may be provided by the depleted region 204 of the field plate layer 206. The depleted region 204 may provide an additional insulating layer in the substantial effect.

The formation of the depleted region 204 may be controlled or adjusted by, for example, an implanting process. In an embodiment, when the depleted region 204 uses an epitaxial growth process, it may be formed by controlling the dopants during the growth process. The formation of the depleted region 204 is not limited to a specific manner.

Figure 3:
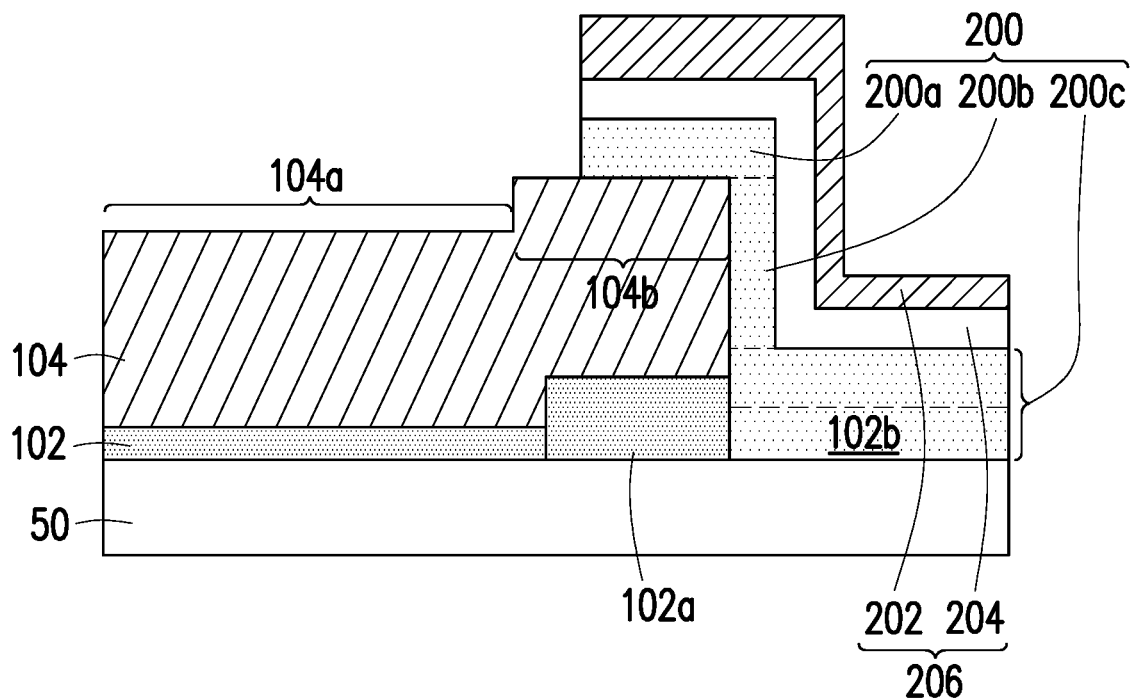
FIG. 3 is a schematic diagram of a cross-sectional structure of a semiconductor device according to yet another embodiment of the disclosure.

FIG. 3 is a schematic diagram of a cross-sectional structure of a semiconductor device according to yet another embodiment of the disclosure. With reference to FIG. 3, in an embodiment, the formation of the depleted region 204 may also be to cover the dielectric layer 200 completely. The formation of the dielectric layer 200 is as described previously and will not be reiterated here.

Figure 4:
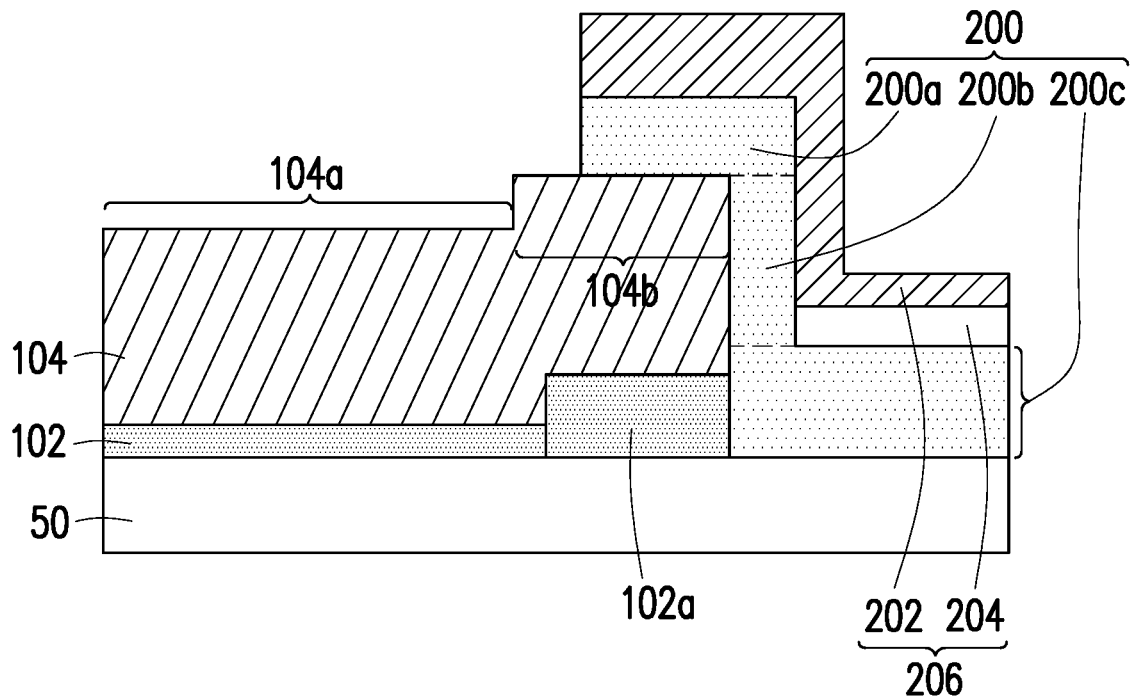
FIG. 4 is a schematic diagram of a cross-sectional structure of a semiconductor device according to still another embodiment of the disclosure.

FIG. 4 is a schematic diagram of a cross-sectional structure of a semiconductor device according to still another embodiment. With reference to FIG. 4, in an embodiment, the dielectric layer 200 may be a single-layer structure of the same material according to a change in the fabrication process. The bottom dielectric layer 200c is, for example, an oxide or a nitride, instead of a stacked layer of an oxide and a nitride.

The dielectric layer 200 of the disclosure may be compatibly formed according to the fabrication process of the devices in the other regions. The depleted region 204 is formed during the formation of the field plate layer 206, under a condition of a thickness that the dielectric layer 200 may be formed, which may further provide the function of an insulating layer to improve the insulation capability at the drain end, thereby increasing the collapse voltage.

Finally, it should be noted that the above embodiments are only used to illustrate the technical solutions of the disclosure, and are not intended to limit them. Although the disclosure has been described in detail with reference to the foregoing embodiments, those of ordinary skill in the art should understand that they can still make changes and modifications to the technical solutions described in the foregoing embodiments, or equivalently replace some or all of the technical features without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A structure of a semiconductor device, comprising:
a substrate;
a first gate insulating layer, disposed on the substrate;
a second gate insulating layer, disposed on the substrate, wherein the second gate insulating layer is thicker than the first gate insulating layer and abuts the first gate insulating layer;
a gate layer, having a first part gate on the first gate insulating layer and a second part gate on the second gate insulating layer, the second part gate covering a top surface of the second gate insulating layer facing away from the substrate, and a top surface of the second part gate being higher than a top surface of the first part gate, wherein an outer sidewall of the second part gate is aligned with an outer sidewall of the second gate insulating layer;
a dielectric layer, having a top dielectric layer, a vertical dielectric layer at a sidewall of the gate layer, and a bottom dielectric layer, wherein the top dielectric layer is in contact with the gate layer, and the bottom dielectric layer is in contact with the substrate and the second gate insulating layer, wherein the top dielectric layer, the vertical dielectric layer, and the bottom dielectric layer are connected together, and wherein the top dielectric layer and the vertical dielectric layer consist of nitride layers, and the bottom dielectric layer consists of a nitride layer and an oxide layer; and
a field plate layer, disposed on the dielectric layer, and comprising a depleted region, and is at least disposed on the bottom dielectric layer, wherein outer sidewalls of opposite ends of the dielectric layer are respectively aligned with outer sidewalls of opposite ends of the field plate layer, the field plate layer further comprises a doped polysilicon layer or a doped silicon layer on the depleted region.

2. The structure of the semiconductor device according to claim 1, wherein the depleted region of the field plate layer provides an insulation capability to the dielectric layer.

3. The structure of the semiconductor device according to claim 1, wherein the depleted region of the field plate layer is only on the bottom dielectric layer.

4. The structure of the semiconductor device according to claim 1, wherein the depleted region of the field plate layer covers the top dielectric layer and the bottom dielectric layer.

5. The structure of the semiconductor device according to claim 1, wherein the field plate layer and the gate layer are to be electrically connected to the same voltage source.

6. A method for fabricating a semiconductor device, comprising:
providing a substrate;
forming a first gate insulating layer and a second gate insulating layer abutting to the first gate insulating layer on the substrate, wherein the second gate insulating layer is thicker than the first gate insulating layer;
forming a gate layer, having a first part gate on the first gate insulating layer and a second part gate on the second gate insulating layer, the second part gate covering a top surface of the second gate insulating layer facing away from the substrate, and a top surface of the second part gate being higher than a top surface of the first part gate, wherein an outer sidewall of the second part gate is aligned with an outer sidewall of the second gate insulating layer;

forming a dielectric layer, having a top dielectric layer, a vertical dielectric layer at a sidewall of the gate layer, and a bottom dielectric layer, wherein the top dielectric layer is in contact with the gate layer, and the bottom dielectric layer is in contact with the substrate and the second gate insulating layer, wherein the top dielectric layer, the vertical dielectric layer, and the bottom dielectric layer are connected together, and wherein the top dielectric layer and the vertical dielectric layer consist of nitride layers, and the bottom dielectric layer consists of a nitride layer and an oxide layer; and forming a field plate layer on the dielectric layer, wherein the field plate layer comprises a depleted region, and is at least disposed on the bottom dielectric layer, wherein outer sidewalls of opposite ends of the dielectric layer are respectively aligned with outer sidewalls of opposite ends of the field plate layer, the field plate layer further comprises a doped polysilicon layer or a doped silicon layer on the depleted region.

7. The method for fabricating the semiconductor device according to claim 6, wherein the depleted region of the formed field plate layer provides an insulation capability to the dielectric layer.

8. The method for fabricating the semiconductor device according to claim 6, wherein the depleted region of the formed field plate layer is only on the bottom dielectric layer.

9. The method for fabricating the semiconductor device according to claim 6, wherein the depleted region of the formed field plate layer covers the top dielectric layer and the bottom dielectric layer.

10. The method for fabricating the semiconductor device according to claim 6, wherein the formed field plate layer and the gate layer are to be electrically connected to the same voltage source.

* * * * *